(12) United States Patent
Nummila et al.

(10) Patent No.: US 8,681,464 B2
(45) Date of Patent: Mar. 25, 2014

(54) VOLTAGE SUPPRESSOR COMPONENT

(75) Inventors: Pasi Oskar Nummila, Turku (FI); Juha Kalevi Tulonen, Tampere (FI)

(73) Assignee: Nokia Corporation, Espoo (FI)

( * ) Notice: Subject to any disclaimer, the term of this patent is extended or adjusted under 35 U.S.C. 154(b) by 146 days.

(21) Appl. No.: 13/265,009

(22) PCT Filed: Apr. 19, 2010

(86) PCT No.: PCT/IB2010/051707
§ 371 (c)(1),
(2), (4) Date: Dec. 5, 2011

(87) PCT Pub. No.: WO2010/119436
PCT Pub. Date: Oct. 21, 2010

(65) Prior Publication Data
US 2012/0069482 A1 Mar. 22, 2012

(30) Foreign Application Priority Data

Apr. 18, 2009 (GB) .................................. 0906750.5

(51) Int. Cl.
*H02H 3/22* (2006.01)
*H01C 7/12* (2006.01)
*H02H 1/00* (2006.01)
*H02H 1/04* (2006.01)
*H02H 9/06* (2006.01)

(52) U.S. Cl.
USPC ........................................ 361/111; 361/118

(58) Field of Classification Search
USPC .................................. 361/111, 118
See application file for complete search history.

(56) References Cited

U.S. PATENT DOCUMENTS

| | | | |
|---|---|---|---|
| 4,616,286 A * | 10/1986 | Breece | 361/56 |
| 4,901,183 A * | 2/1990 | Lee | 361/56 |
| 5,164,874 A | 11/1992 | Okano et al. | 361/56 |
| 6,040,971 A * | 3/2000 | Martenson et al. | 361/118 |
| 6,164,874 A * | 12/2000 | May | 405/283 |
| 7,333,316 B1 * | 2/2008 | Norris | 361/111 |
| 7,684,164 B2 * | 3/2010 | Wong et al. | 361/93.6 |
| 7,684,165 B2 | 3/2010 | Berberich et al. | 361/103 |
| 2005/0265009 A1 | 12/2005 | Fussinger et al. | 361/777 |
| 2006/0227481 A1 | 10/2006 | Huang et al. | 361/104 |
| 2007/0145565 A1 | 6/2007 | Miyata et al. | 257/690 |
| 2007/0230080 A1 * | 10/2007 | Pozzuoli | 361/111 |
| 2009/0230506 A1 * | 9/2009 | Park | 257/529 |
| 2009/0246988 A1 * | 10/2009 | Yang et al. | 439/86 |

FOREIGN PATENT DOCUMENTS

| | | |
|---|---|---|
| EP | 0510900 A2 | 10/1992 |
| EP | 1199750 A2 | 4/2002 |
| EP | 1 313 193 A1 | 5/2003 |
| EP | 1 693 944 A2 | 8/2006 |
| FR | 2 917 535 | 12/2008 |
| FR | 2917535 A1 | 12/2008 |
| GB | 1 467 631 | 3/1977 |
| JP | 2005-083935 | 3/2005 |
| WO | WO 99/56374 | 11/1999 |
| WO | WO 2007/110850 | 10/2007 |

\* cited by examiner

*Primary Examiner* — Dharti Patel
(74) *Attorney, Agent, or Firm* — Harrington & Smith

(57) ABSTRACT

A voltage suppressor component including a semiconductor layer; a first port mounted on the semiconductor layer and configured to receive electrical power; a second port mounted on the semiconductor layer and configured to provide the electrical power, and a fuse in electrical series between the first port and the second port and mounted on the semiconductor layer.

20 Claims, 9 Drawing Sheets

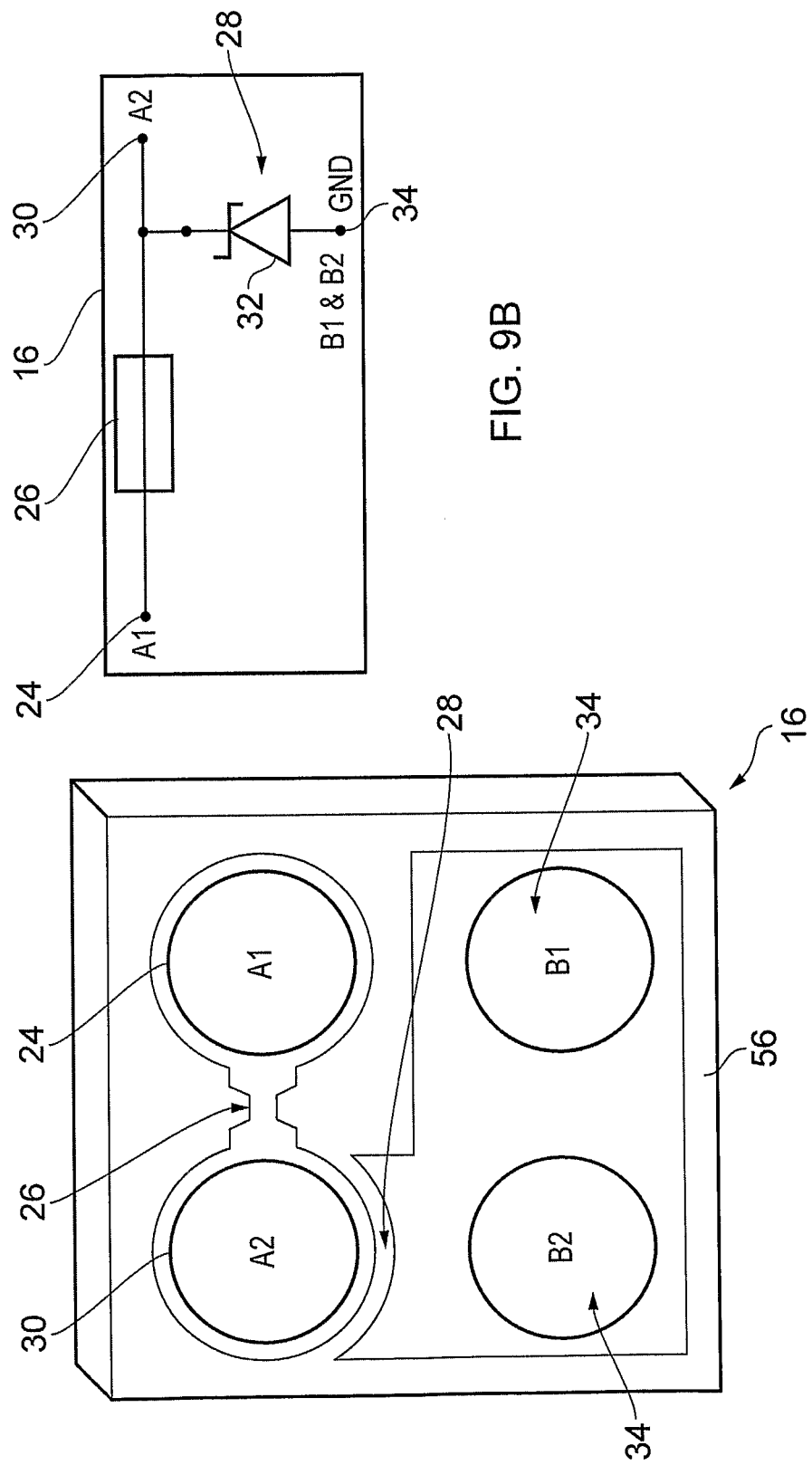

VOLTAGE SUPPRESSOR COMPONENT

FIELD OF THE INVENTION

Embodiments of the present invention relate to a voltage suppressor component for protecting electronic components. In particular, they relate to a voltage suppressor component for protecting electronic components in a mobile cellular telephone.

BACKGROUND TO THE INVENTION

Apparatus such as mobile cellular telephones usually include a rechargeable electrical energy storage device (a battery for example) that is used to power the electronic components within the apparatus. For example, a loudspeaker of the apparatus may receive electrical energy from the electrical energy storage device that enables the loudspeaker to vibrate and provide sound waves to a user of the apparatus.

The rechargeable electrical energy storage device is usually connected to charging control circuitry and a socket. An external source of electrical energy ('mains' electricity for example) may be connected to the electrical energy storage device and used to re-charge the storage device. However, the external source of electrical energy may vary in voltage and/or current over time and these surges may cause damage to the charging control circuitry and/or other circuitry. For example, the external source of electrical energy may vary due to a fault or may be non-specified and therefore be unknown to the manufacturer of the apparatus. Additionally, a user of the apparatus may accidentally provide a potentially damaging voltage and/or current to the circuitry of the apparatus by touching the socket and providing an electrostatic discharge.

It would be desirable to provide a component for protecting electronic components in such an apparatus.

BRIEF DESCRIPTION OF VARIOUS EMBODIMENTS OF THE INVENTION

According to various, but not necessarily all, embodiments of the invention there is provided a voltage suppressor component comprising: a semiconductor layer; a first port mounted on the semiconductor layer and configured to receive electrical power; a second port mounted on the semiconductor layer and configured to provide the electrical power, and a fuse in electrical series between the first port and the second port and mounted on the semiconductor layer.

The voltage suppressor component may also be referred to as an integrated fuse and voltage suppressor component. The voltage suppressor component may be for protecting electronic circuitry from voltages over a predetermined threshold voltage. The voltage suppressor component may be for protecting electronic circuitry from a current above a predetermined threshold current.

The semiconductor layer may comprise silicon.

The voltage suppressor component may be a single discrete semiconductor component. The voltage suppressor component may be a single discrete silicon component.

The voltage suppressor component may further include a member, connected between the first port and the second port. The member may be configured to suppress a voltage above a predetermined threshold voltage. The member may be a transient voltage suppressor. The member may include a transient voltage suppression diode, connected between the first and second ports and ground. The transient voltage suppression diode may be configured to provide an electrical path to ground for a voltage above the predetermined threshold voltage. The transient voltage suppression diode may be formed in the semiconductor layer.

The second port may be configured to connect to charging control circuitry. The voltage suppressor component may be configured to suppress the voltage supplied to the charging control circuitry.

The voltage suppressor component may be a discrete electronic component that is configured to be incorporated into an apparatus.

According to various, but not necessarily all, embodiments of the invention there is provided an apparatus comprising a voltage suppressor component as described in any of the preceding paragraphs.

According to various, but not necessarily all, embodiments of the invention there is provided a mobile cellular telephone comprising a voltage suppressor component as described in any of the preceding paragraphs.

According to various, but not necessarily all, embodiments of the invention there is provided packaging comprising one or more voltage suppressor components as described in any of the preceding paragraphs.

According to various, but not necessarily all, embodiments of the invention there is provided. a method comprising: providing a voltage suppressor component including a semiconductor layer, a first port mounted on the semiconductor layer and configured to receive electrical power, a second port mounted on the semiconductor layer and configured to provide the electrical power, and providing a fuse in electrical series between the first port and the second port and mounted on the semiconductor layer.

The method may further comprise providing a member between the first port and the second port. The member may be configured to suppress a voltage above a predetermined threshold voltage. The member may be a transient voltage suppressor.

The member may include a transient voltage suppression diode, connected between the first and second ports and ground. The transient voltage suppression diode may be configured to provide an electrical path to ground for a voltage above the predetermined threshold voltage. The transient voltage suppression diode may be formed in the semiconductor layer.

The method may further comprise configuring the second port to connect to charging control circuitry. The voltage suppressor component may be configured to suppress the voltage supplied to the charging control circuitry.

The voltage suppressor component may be a discrete electronic component that is configured to be incorporated into an apparatus.

According to various, but not necessarily all, embodiments of the invention there is provided a method comprising: providing a voltage suppressor component, as described in any of the preceding paragraphs, incorporated in an apparatus; providing an electrical test signal to the first port; determining whether the voltage suppressor component is electrically connected within the apparatus.

The method may further comprise electrically connecting the voltage suppressor component within the apparatus if the voltage suppressor component is not electrically connected within the apparatus.

According to various, but not necessarily all, embodiments of the invention there is provided a discrete electronic component comprising: a first port configured for receiving electrical power; a second port configured for providing the electrical power; a fuse between the first port and the second port;

and a voltage suppressor between the first port and the second port and configured to suppress a voltage above a predetermined threshold voltage.

According to various, but not necessarily all, embodiments of the invention there is provided a discrete electronic component comprising: a first port connected to an electrical power input; a second port connected to an electrical power output; and a voltage suppressor between the first port and the second port and configured to suppress a voltage above a predetermined threshold voltage.

According to various, but not necessarily all, embodiments of the invention there is provided a voltage suppressor component comprising: a first port configured to receive electrical power; a second port configured to provide the electrical power, and a fuse in electrical series between the first port and the second port, wherein the voltage suppressor component is a single discrete semiconductor component.

BRIEF DESCRIPTION OF THE DRAWINGS

For a better understanding of various examples of embodiments of the present invention reference will now be made by way of example only to the accompanying drawings in which:

FIG. 9A illustrates a plan view diagram of a further voltage suppressor component according to various embodiments of the invention;

FIG. 9B illustrates a schematic diagram of the voltage suppressor component illustrated in FIG. 9A.

DETAILED DESCRIPTION OF VARIOUS EMBODIMENTS OF THE INVENTION

Figure 2:
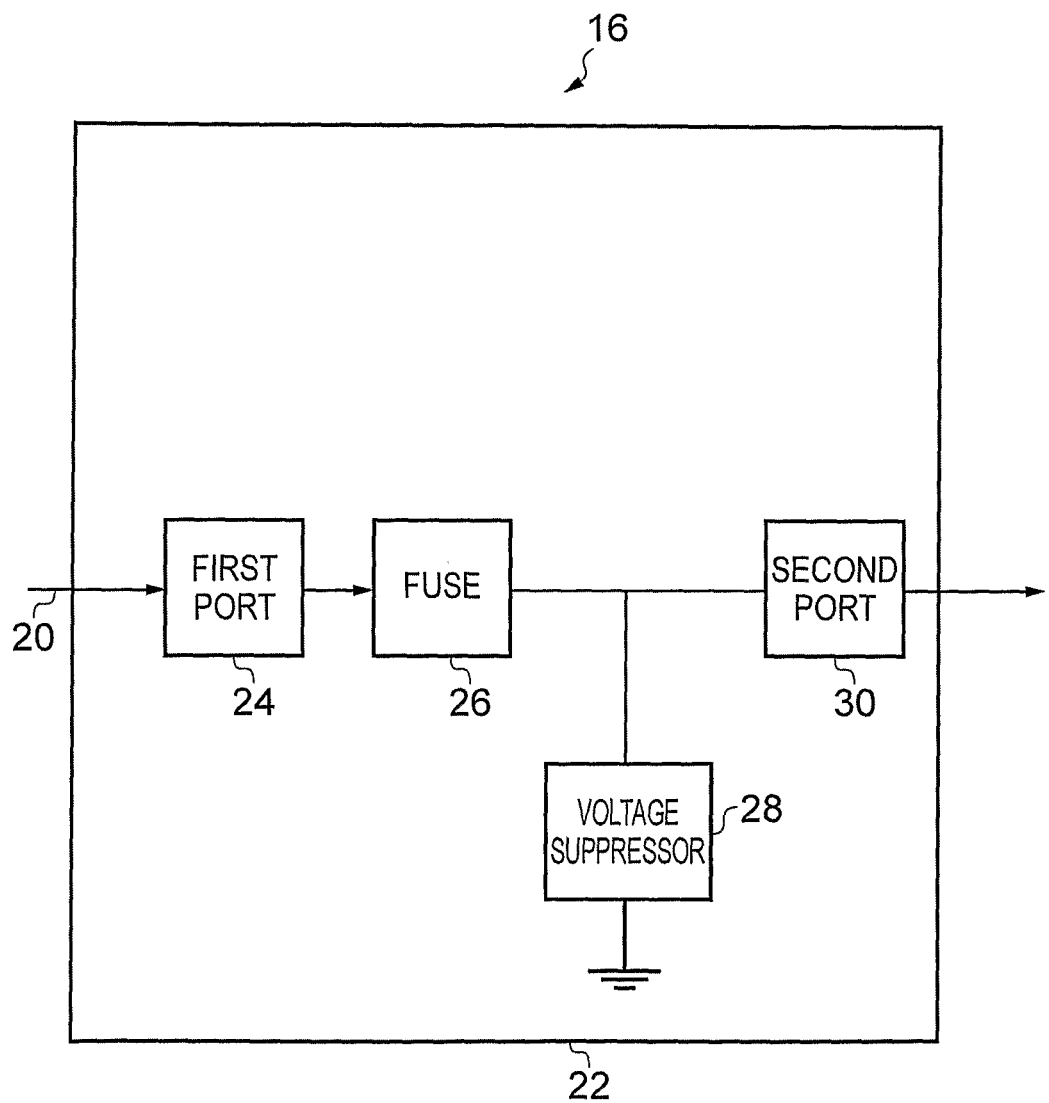
FIG. 2 illustrates a schematic diagram of a voltage suppressor component according to various embodiments of the invention.
Figure 4:
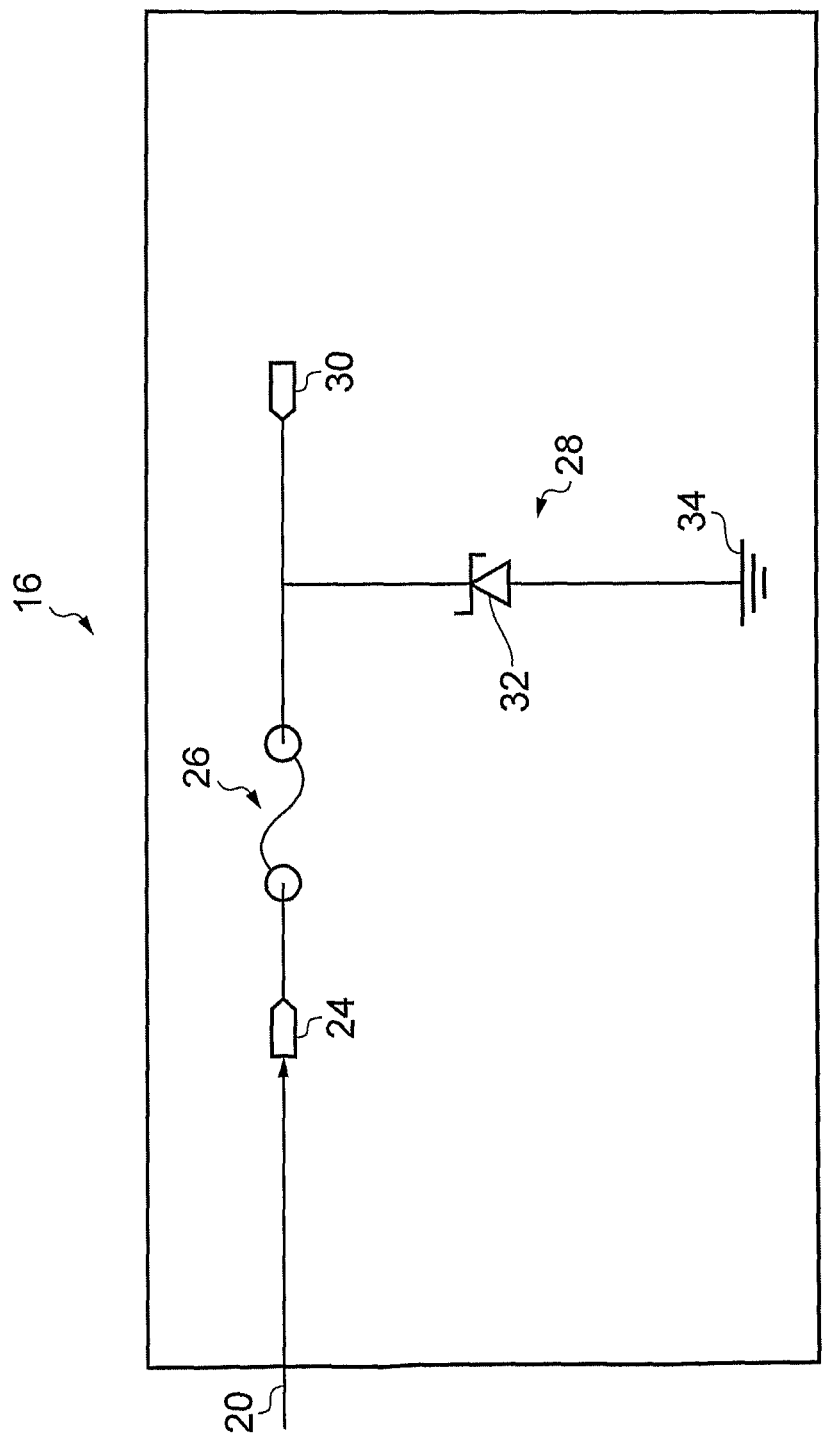
FIG. 4 illustrates a schematic diagram of a voltage suppressor component according to various embodiments of the invention.

FIGS. 2 and 4 illustrate a voltage suppressor component 16, comprising: a first port 24 configured for receiving electrical power, a second port 30 configured for providing the electrical power, and a fuse 26 in electrical series between the first port 24 and the second port 30.

In the following description, the wording 'connect' and 'couple' and their derivatives mean operationally connected/coupled. It should be appreciated that any number or combination of intervening components can exist (including no intervening components).

Figure 1:
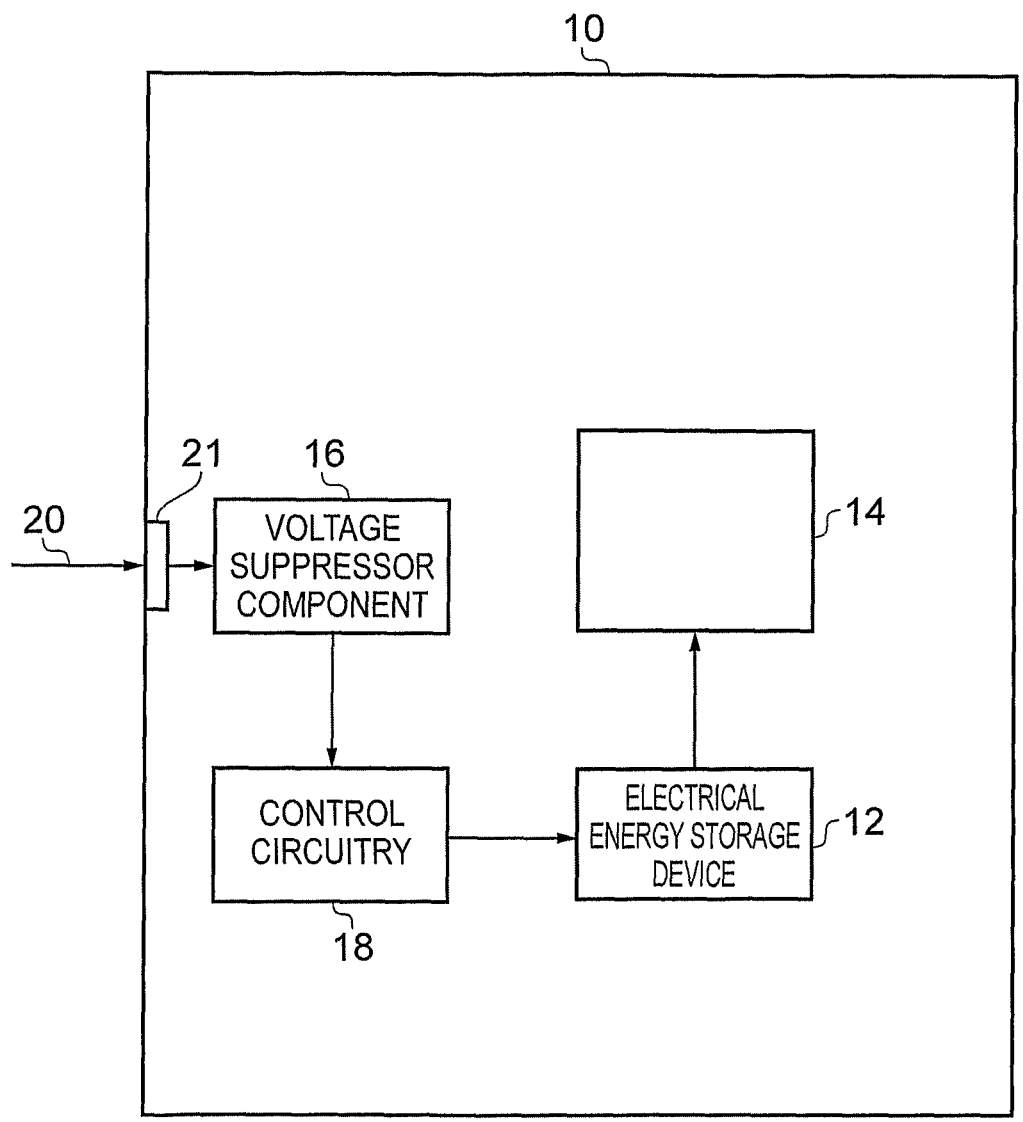
FIG. 1 illustrates a schematic diagram of an apparatus including a voltage suppressor component according to various embodiments of the invention.

FIG. 1 illustrates a schematic diagram of an apparatus 10 including an electrical energy storage device 12, functional circuitry 14, a voltage suppressor component 16 and control circuitry 18. The apparatus 10 may be any device and may be, for example, a portable device such as a mobile cellular telephone, a personal digital assistant (PDA), a palmtop computer or a laptop computer.

The electrical energy storage device 12 may be any device that is capable of storing electrical energy. For example, the electrical energy storage device 12 may be a battery (a device that converts chemical energy to electrical energy) and may be, for example, a nickel cadmium (NiCd) battery, a nickel metal hydride (NiMH) battery, lithium-ion (Li-ion) battery, or a lithium ion polymer battery. The electrical energy storage device 12 may be charged by connecting the device 12 to an electrical power supply (for example, a charging adapter connected to 'mains' electricity).

The functional circuitry 14 may include any other circuitry of the apparatus 10. For example, in the embodiment where the apparatus 10 is a mobile cellular telephone, the functional circuitry 14 may include a processor, a memory, a loudspeaker, a microphone, a display, a transceiver and one or more antennas. The electrical energy storage device 12 is configured to provide electrical energy to the functional circuitry 14 to enable the circuitry 14 to function. For example, the electrical energy storage device 12 may provide electrical energy to the display so that images, videos and text may be displayed to a user of the apparatus 10.

The voltage suppressor component 16 is configured to receive electrical energy/power 20 and provide the electrical energy to the electrical energy storage device 12 via the control circuitry 18 for charging. In various embodiments, the voltage suppressor component 16 is configured to receive the electrical energy 20 from an electrical power supply (a charging adapter connected to 'mains' electricity for example) via a connector 21 (such as a socket for example).

The voltage suppressor component 16 is configured to prevent at least the control circuitry 18 from being damaged by the electrical energy 20 when the electrical energy 20 has a voltage greater than a predetermined threshold voltage. The voltage suppressor component 16 is also configured to prevent at least the control circuitry 18 from being damaged by the electrical energy 20 when the electrical energy 20 has a current greater than a predetermined threshold current. The voltage suppressor component 16 is described in more detail in the following paragraphs.

The control circuitry 18 is configured to control the charging of the electrical energy storage device 12. For example, the charging control circuitry 18 may be configured to prevent the electrical energy storage device 12 from overcharging. The control circuitry 18 may be an integrated circuit or a processor that is configured to execute computer program instructions stored in a memory.

FIG. 2 illustrates a schematic diagram of a voltage suppressor component 16 according to various embodiments of the present invention. Where the features illustrated in FIG. 2 are similar to the features illustrated in FIG. 1, the same reference numerals are used.

The voltage suppressor component 16 includes a housing 22, a first port 24, a fusible link (fuse) 26, a voltage suppressor 28 and a second port 30. The voltage suppressor component 16 may be an electronic component where substantially all of the circuitry of the component is housed within the housing 22. A person may view a voltage suppressor component 16 as a discrete unit where substantially all of the circuitry is hidden from the person's view by the housing 22. It should be appreciated that some circuitry such as connector pins may extend out of the housing 22. The voltage suppressor component 16 may be a module for incorporation into an apparatus 10 such as a mobile cellular telephone. As used here, 'module' refers to a unit or apparatus that excludes certain parts/components that would be added by an end manufacturer or a user.

Figure 3:
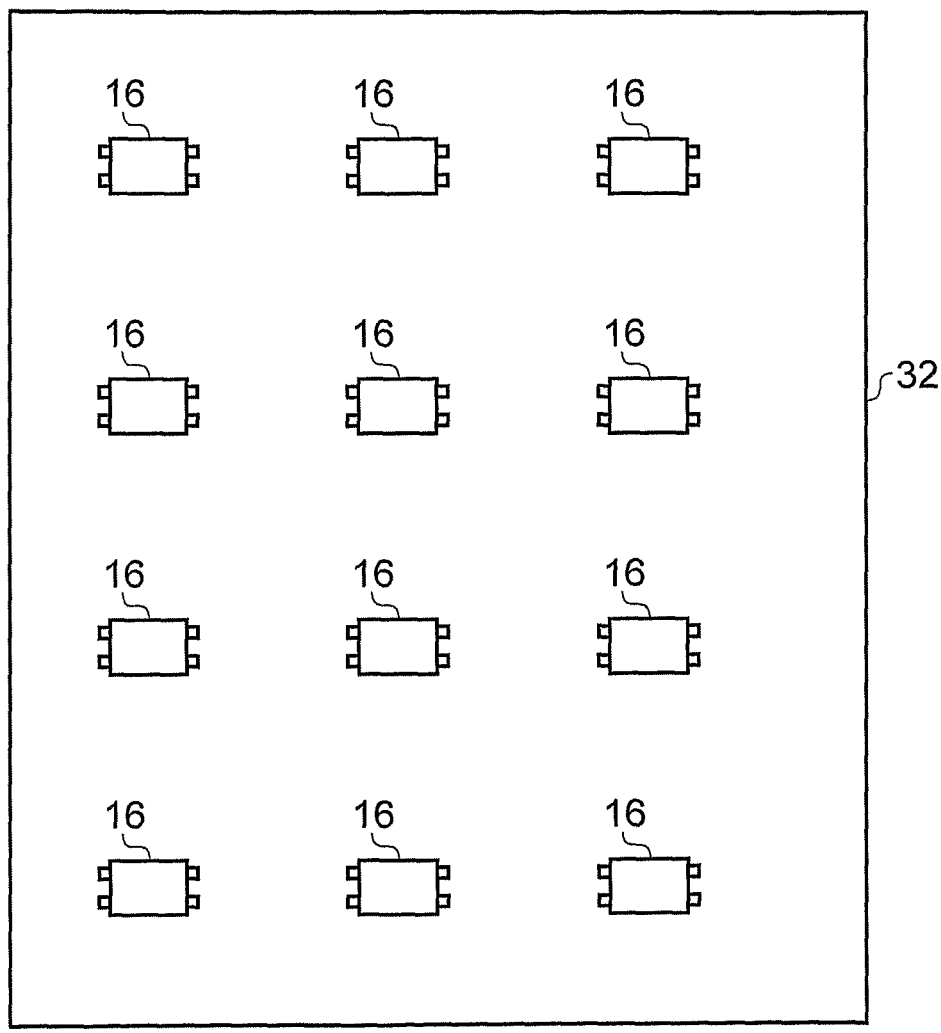
FIG. 3 illustrates a diagram of packaging including a plurality of voltage suppressor components according to various embodiments of the invention.

The voltage suppressor component 16 may be produced in a first factory and then transported, as a discrete electronic component, in packaging to a second factory where it may be incorporated into the apparatus 10. For example, FIG. 3 illustrates packaging 32 that includes a plurality of voltage suppressor components 16. The packaging 32 may be substantially waterproof (it may comprise plastic material for example) and may be arranged to prevent the voltage suppressor components 16 from contacting one another during transportation.

Returning to FIG. 2, the first port 24 is configured to receive the electrical energy 20. The first port 24 may be connected to an input pin (not illustrated in the figure) that extends at least partially out of the housing 22 and which may be connected to a socket 21 of the apparatus 10.

The fuse 26 is connected between the first port 24 and the second port 30 and receives the electrical energy 20 from the first port 24. The fuse 26 is configured to prevent the electrical energy 20 from being provided to the second port 30 when the electrical energy 20 has a current that is greater than a predetermined threshold current (a current which may cause damage to the charging control circuitry 18 for example).

In various embodiments, the fuse 26 may comprise a length of wire that extends in electrical series between the first port 24 and the second port 30. The length, cross sectional area and material of the wire are selected so that the wire breaks when the current of the electrical energy 20 exceeds the predetermined threshold current. Since there are no other galvanic connections between the first port 24 and the second port 30, the fuse 26 (when broken) prevents the electrical energy 20 from being provided to the second port 30 and thereby to the control circuitry 18.

The voltage suppressor 28 is connected between the electrical path that connects the fuse 26 and the second port 30, and ground. The voltage suppressor 28 is configured to prevent the electrical energy 20 from being provided to the second port 30 when the electrical energy 20 has a voltage that is greater than a predetermined threshold voltage (a voltage which may cause damage to the charging control circuitry 18 for example).

In various embodiments, the voltage suppressor 28 may be a transient voltage suppressor which is configured to react to, and protect the charging control circuitry 18 from, sudden and/or momentary overvoltage conditions. The voltage suppressor 28 may comprise a transient voltage suppression diode (a zener diode for example) or a metal oxide varistor (MOV).

The second port 30 is connected to the fuse 26 and is configured to receive the electrical energy 20 from the fuse 26. The second port 30 may be connected to an output pin (not illustrated in the figure) that extends at least partially out of the housing 22 and which may be connected to the control circuitry 18.

FIG. 4 illustrates a schematic diagram of a voltage suppressor component 16 according to various embodiments of the invention. Where the features illustrated in FIG. 4 are similar to the features illustrated in FIGS. 1 and 2, the same reference numerals are used.

The voltage suppressor component 16 includes a first port 24, a fuse 26, a voltage suppressor 28 and a second port 30. The voltage suppressor 28 includes a zener diode 32 that is connected between the electrical path that connects the fuse 26 and the second port 30, and ground 34. The zener diode 32 is configured so that it has a relatively high impedance when the voltage of the electrical energy 20 is below a predetermined threshold voltage (the 'avalanche breakdown potential'). Consequently, when the voltage of the electrical energy 20 is below the predetermined threshold voltage, the electrical energy 20 flows from the first port 24 to the second port 30 with little to no current flowing through the zener diode 32 to ground 34.

The zener diode 32 is also configured so that it has a relatively low impedance (substantially equal to zero ohms) when the voltage of the electrical energy 20 is above the predetermined threshold voltage. Consequently, when the voltage of the electrical energy 20 is above the predetermined threshold voltage, the electrical energy 20 flows from the first port 24 to ground 34 with little to no current flowing to the second port 30.

The predetermined threshold voltage of the zener diode 32 may be selected so that increases (spikes/surges) in the voltage in the electrical energy 20 that may damage the charging control circuitry 18 are shunted to ground 34 and not provided to the charging control circuitry 18. The design of zener diodes and other transient voltage suppression diodes is well known in the art of electronics and will not be described in detail here.

Embodiments of the present invention may provide several advantages. One such advantage is that the voltage suppressor component 16 may be a single discrete electronic component which may be incorporated into an apparatus and may protect other electronic components from increases in the received voltage and current. Consequently, the voltage suppressor component 16 may increase the useable life of the apparatus 10 and decrease the number of apparatus that require repair in any given time period.

Furthermore, since the voltage suppressor component 16 includes a fuse and a voltage suppressor within a single housing, the voltage suppressor component 16 may require less surface area on a printed wiring board and may reduce the number of components that need to be connected to the printed wiring board. Additionally, the voltage suppressor component 16 may have a lower monetary cost than a separate fuse and a separate voltage suppressor.

Figure 5:
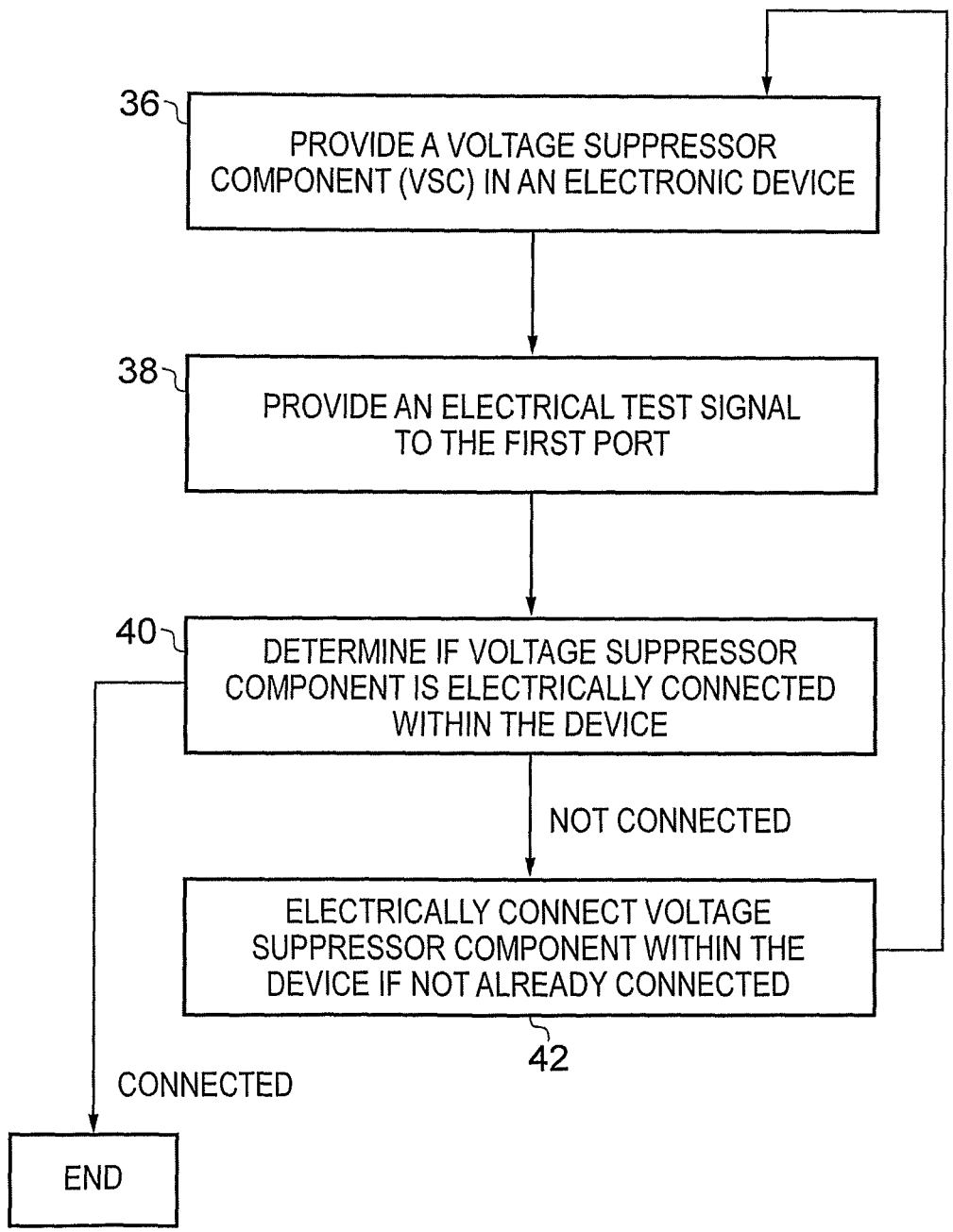
FIG. 5 illustrates a flow diagram of a method according to various embodiments of the invention.

FIG. 5 illustrates a flow diagram of a method of electrical assembly testing according to various embodiments of the invention. The following method is described with reference to FIGS. 1, 2 and 4 and may enable a manufacturer to determine whether the voltage suppressor component 16 is electrically connected within the apparatus 10.

At block 36 the method includes providing a voltage suppressor component 16 incorporated in an apparatus 10. Prior to block 36, the apparatus 10 was put through a manufacturing process to electrically connect the voltage suppressor component 16 to the connector 21 and to the charging control circuitry 18.

At block 38, the method includes providing an electrical test signal to the first port 24. The electrical test signal may be applied at the connector 21 and thereby provided to the first port 24. The electrical test signal has a voltage that is lower than the predetermined threshold voltage of the voltage suppressor 28 and a current that is lower than the predetermined threshold current.

At block 40, the method includes determining if the voltage suppressor component 16 is electrically connected within the apparatus 10. For example, voltage and/or current may be measured at the charging control circuitry 18 to determine if the electrical test signal has flowed to the charging control circuitry 18. If the voltage and/or current measurements indicate that the electrical test signal has flowed to the charging control circuitry 18, the manufacturer knows that the voltage suppressor component 16 is electrically connected within the apparatus 10.

If the voltage and/or current measurements indicate that the electrical test signal has not flowed to the charging control circuitry 18, the method moves to block 42 and the voltage suppressor component 16 is electrically connected within the apparatus 10. The method then moves to block 36 again to determine whether the electrical connection made in block 42 has been made successfully.

Embodiments of the present invention provide an advantage in that they may enable a manufacturer to determine whether the voltage suppressor component 16 has been electrically connected within apparatus 10. If the determination suggests that the voltage suppressor component 16 is electrically connected, the manufacturer then knows that the charging control circuitry 18 is protected from surges in voltage and current. If the determination suggests that the voltage suppressor component 16 is not electrically connected, the manufacturer then knows that the voltage suppressor component 16 should be electrically connected once again and the method repeated. This may result in the apparatus 10 having greater reliability and being easier to test during assembly testing.

Figure 6:
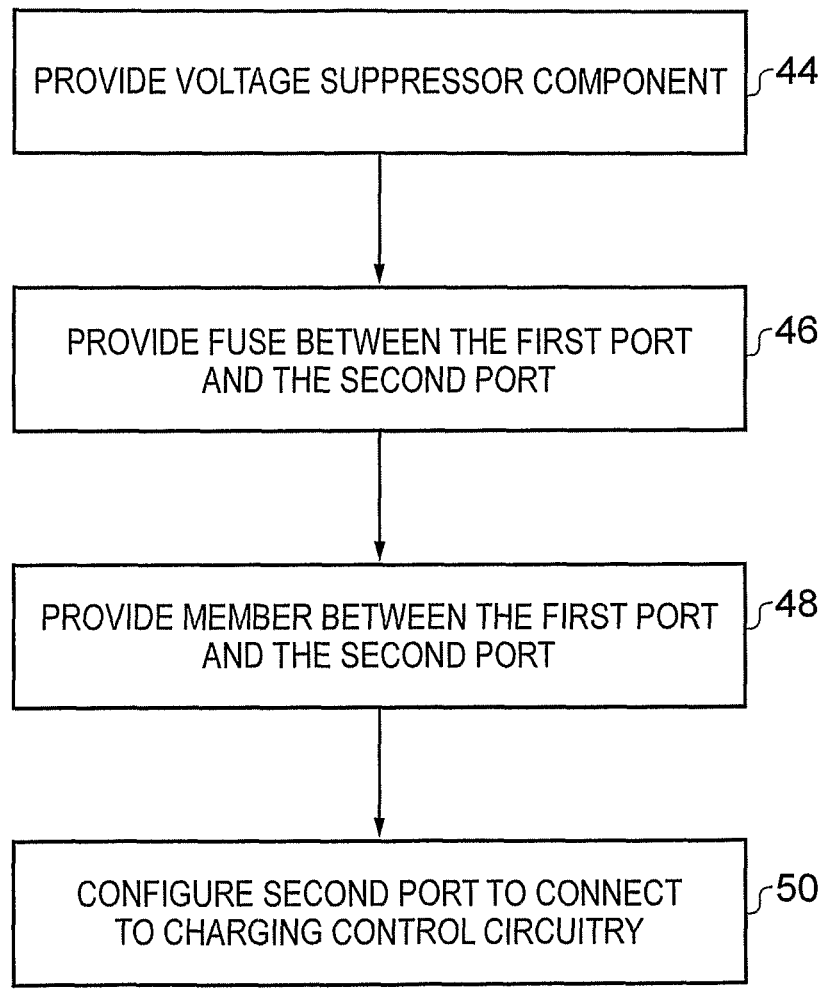
FIG. 6 illustrates a flow diagram of another method according to various embodiments of the invention.

FIG. 6 illustrates a method of manufacturing a voltage suppressor component 16 according to various embodiments of the present invention. At block 44, the method includes providing a voltage suppressor component 16 including a first port 24 and a second port 30.

At block 46, the method includes providing the fuse 26 in electrical series between the first port 24 and the second port 30.

At block 48, the method includes providing a member 28 (a voltage suppressor) between the first port 24 and the second port 30 that is configured to suppress voltages that exceed a predetermined threshold voltage. The member 28 may be connected between the electrical path between the fuse 26 and the second port 30, and ground.

At block 50, the second port 30 is configured to connect to the charging control circuitry 18. Additionally, the first port 24 may be configured to connect to the connector 21. The first and second ports 24, 30 may be configured by connecting them to pins that may connect to a printed wiring board.

The illustration of a particular order to the blocks in FIGS. 5 and 6 does not necessarily imply that there is a required or preferred order for the blocks and the order and arrangement of the block may be varied. Furthermore, it may be possible for some steps to be omitted.

Figure 8:
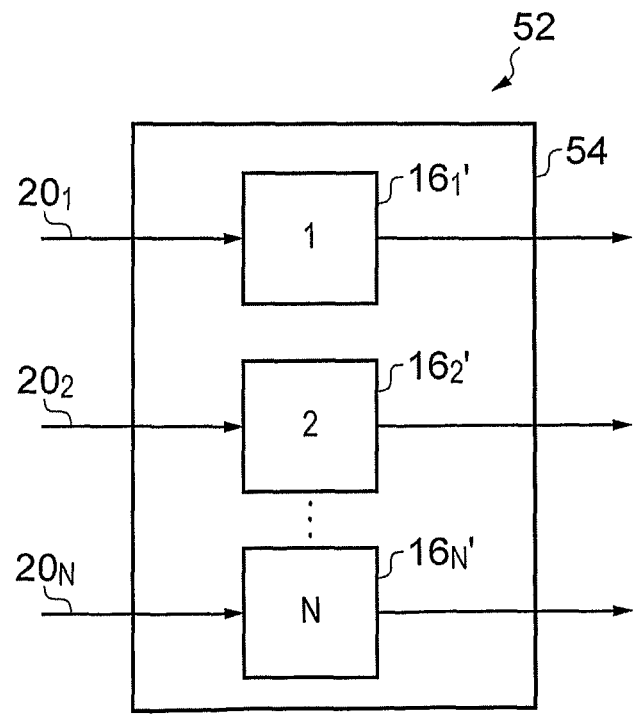
FIG. 8 illustrates a schematic diagram of another voltage suppressor component according to various embodiments of the invention.

FIG. 8 illustrates a schematic diagram of another voltage suppressor component 52 according to various embodiments of the present invention. The voltage suppressor component 52 includes a plurality of voltage suppressor components 16' as illustrated in FIG. 2 or 4 which may arranged electrically parallel to one another. Each of the voltage suppressor components may receive and output a different electrical signal 20.

In these embodiments, the voltage suppressor components 16' do not include the housing 22. Instead, the voltage suppressor component 52 includes a housing 54 that houses the plurality of voltage suppressor components 16' together. Consequently, the voltage suppressor 52 may be a discrete electronic component that may be incorporated into an apparatus 10 and used for a data bus, for example.

Figure 9C:
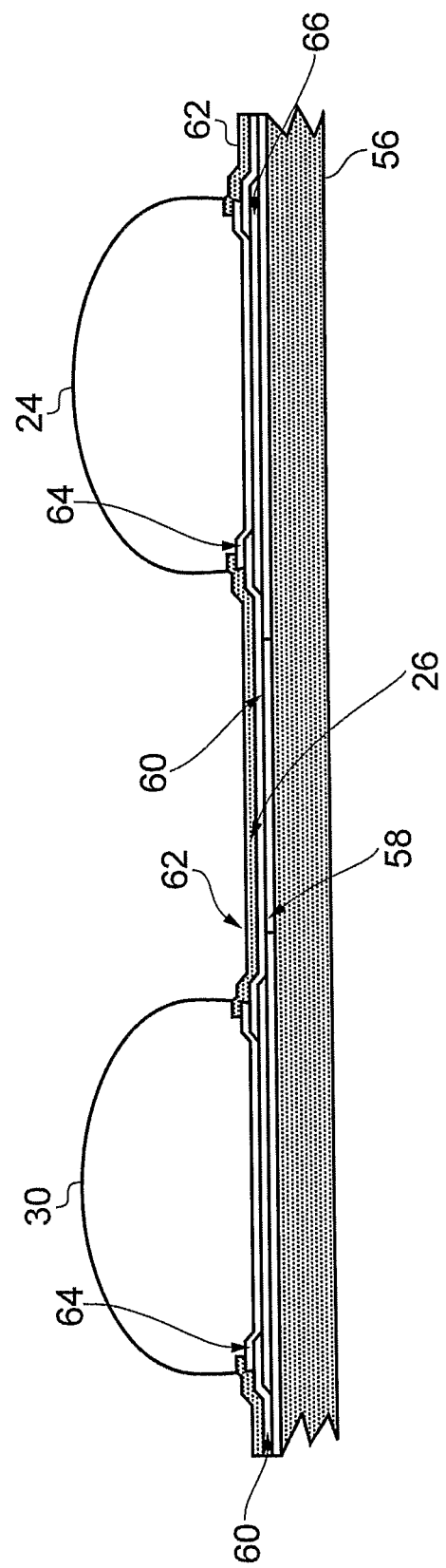
FIG. 9C illustrates a cross sectional side view of the voltage suppressor component illustrated in FIGS. 9A and 9B.

FIGS. 9A, 9B and 9C illustrate a further voltage suppressor component 16 according to various embodiments of the invention. The voltage suppressor component 16 is similar to the voltage suppressor component illustrated in FIGS. 2 and 4 and where the features are similar, the same reference numerals are used. Furthermore, the voltage suppressor component 16 illustrated in FIGS. 9A, 9B and 9C operates as described above with reference to FIGS. 2 and 4.

The voltage suppressor component 16 illustrated in FIGS. 9A, 9B and 9C differs from the components illustrated in FIGS. 2 and 4 in that it further includes a semiconductor layer 56 (which may comprise, for example, silicon or germanium). The first port A1 24, the second port A2 30 and the ground ports B1, B2 34 form 'bumps' which are mounted on the semiconductor layer 56. The fuse 26 is connected in series between the first port 24 and the second port 30 and is also mounted on the semiconductor layer 56. It should be appreciated that the wording 'mounted' means that there may be any number of intervening layers (including no layers) between a part and the semiconductor layer 56.

The fusing time, current and other electrical properties of the fuse 26 depend on the shape and composition (for example, copper, aluminum and so on) of the fuse 26. The zener diode 28 is formed from a p-n junction in the semiconductor layer 56 and is connected between the electrical path that connects the fuse 26 and the second port 30, and the ground port B2 34. The breakdown voltage and other electrical properties of the zener diode 28 depend on the length and shape of the p-n junction formed in the semiconductor layer 56.

FIG. 9C illustrates a cross sectional diagram of the voltage suppressor component 16 illustrated in FIGS. 9A and 9B through the first and second ports 24, 30. As illustrated in FIG. 9C, the voltage suppressor component 16 also includes semiconductor passivation 58, first polymer passivation 60, second polymer passivation 62, conductive layers 64 and further conductive layers 66.

The semiconductor passivation 58 forms a layer adjacent the semiconductor layer 56 and is arranged to inhibit corrosion of the semiconductor layer 56. The semiconductor passivation layer 58 may or may not extend below the second port 30. In the illustrated example, the semiconductor passivation 58 layer does not extend below the second port 30. First polymer passivation 60 forms a layer adjacent a bottom surface of the fuse 26 and is arranged to inhibit corrosion of the fuse 26. Second polymer passivation 62 also forms a layer adjacent a top surface of the fuse 26 and is arranged to inhibit corrosion of the fuse 26. The conductive layers 64 are arranged underneath the first and second ports 24, 30 and may be referred to as 'Under Bump Metal' (UBM). The conductive layers 64 may comprise the same material as the fuse 26 (for example, copper, aluminum and so on). The further conductive layers 66 are arranged underneath the conductive layers 64 and may comprise aluminum. The conductive layers 64, 66 are provided to enable electrical energy to flow from the first port 24 to the second port 30.

Embodiments of the present invention provide an advantage in that the voltage suppressor component 16 provides a single semiconductor (silicon for example) component that is configured to provide over current, over voltage and wrong polarity protection.

Figure 7:
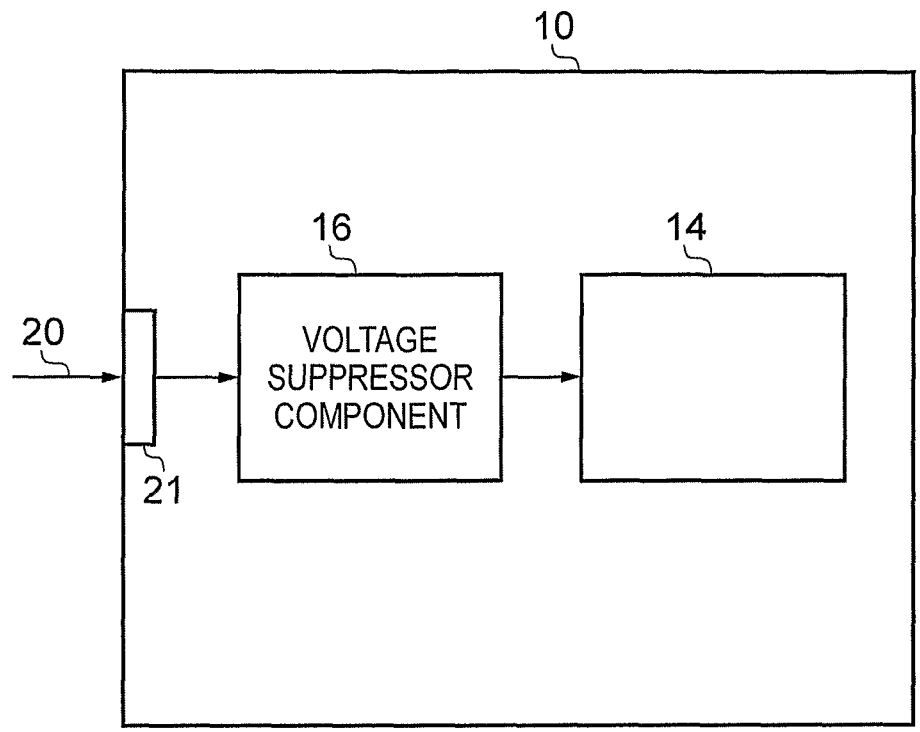
FIG. 7 illustrates a schematic diagram of another apparatus including a voltage suppressor component according to various embodiments of the invention.

Although embodiments of the present invention have been described in the preceding paragraphs with reference to various examples, it should be appreciated that modifications to the examples given can be made without departing from the scope of the invention as claimed. For example, embodiments of the present invention may be incorporated in an apparatus that does not include an electrical energy storage device as illustrated in FIG. 7. In these embodiments, the voltage suppressor component 16 may be connected between a socket 21 and other circuitry 14 and may be configured to protect the other circuitry 14 from over voltage and over current conditions in electrical energy/power received from an external source. In other embodiments, the voltage suppressor component 16 may be provided in a data line (that is, a connection for carrying data, for example, between a processor and a display).

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

We claim:

1. A voltage suppressor component comprising:
    a semiconductor layer;
    a first port mounted on the semiconductor layer and configured to receive electrical power;
    a second port mounted on the semiconductor layer and configured to provide the electrical power,
    a fuse in electrical series between the first port and the second port and mounted on the semiconductor layer; and
    a polymer passivation layer between the fuse and the semiconductor layer.

2. A voltage suppressor component as claimed in claim 1, further comprising a member, connected between the first port and the second port, and configured to suppress a voltage above a predetermined threshold voltage.

3. A voltage suppressor component as claimed in claim 2, wherein the member is a transient voltage suppressor.

4. A voltage suppressor component as claimed in claim 2, wherein the member includes a transient voltage suppression diode, connected between the first and second ports and ground, and configured to provide an electrical path to ground for a voltage above the predetermined threshold voltage, and wherein the transient voltage suppression diode is formed in the semiconductor layer.

5. A voltage suppressor component as claimed in claim 1, wherein the second port is configured to connect to charging control circuitry and the voltage suppressor component is configured to suppress the voltage supplied to the charging control circuitry.

6. A voltage suppressor component as claimed in claim 1, wherein the voltage suppressor component is a discrete electronic component that is configured to be incorporated into an apparatus.

7. A voltage suppressor component as claimed in claim 1, wherein the polymer passivation layer is positioned adjacent a bottom surface of the fuse.

8. A voltage suppressor component as claimed in claim 1, further comprising a semiconductor passivation layer between the semiconductor layer and the polymer passivation layer.

9. An apparatus comprising a voltage suppressor component as claimed in claim 1.

10. A mobile cellular telephone comprising a voltage suppressor component as claimed in claim 1.

11. Packaging comprising one or more voltage suppressor components as claimed in claim 1.

12. A method comprising:
    providing a voltage suppressor component as claimed in claim 1 incorporated in an apparatus;
    providing an electrical test signal to the first port;
    determining whether the voltage suppressor component is electrically connected within the apparatus.

13. A method as claimed in claim 12, further comprising electrically connecting the voltage suppressor component within the apparatus if the voltage suppressor component is not electrically connected within the apparatus.

14. A method comprising:
    providing a voltage suppressor component including a semiconductor layer, a first port mounted on the semiconductor layer and configured to receive electrical power, a second port mounted on the semiconductor layer and configured to provide the electrical power,
    providing a fuse in electrical series between the first port and the second port and mounted on the semiconductor layer; and
    providing a polymer passivation layer between the fuse and the semiconductor layer.

15. A method as claimed in claim 14, further comprising providing a member between the first port and the second port, wherein the member is configured to suppress a voltage above a predetermined threshold voltage.

16. A method as claimed in claim 15, wherein the member is a transient voltage suppressor.

17. A method as claimed in claim 15, wherein the member includes a transient voltage suppression diode, connected between the first and second ports and ground, and configured to provide an electrical path to ground for a voltage above the predetermined threshold voltage and wherein the transient voltage suppression diode is formed in the semiconductor layer.

18. A method as claimed in claim 14, further comprising configuring the second port to connect to charging control circuitry and the voltage suppressor component is configured to suppress the voltage supplied to the charging control circuitry.

19. A method as claimed in claim 14, wherein the polymer passivation layer is positioned adjacent a bottom surface of the fuse.

20. A method as claimed in claim 14, further comprising providing a semiconductor passivation layer between the semiconductor layer and the polymer passivation layer.

* * * * *